US010185016B2

(12) United States Patent
Lai et al.

(10) Patent No.: US 10,185,016 B2
(45) Date of Patent: Jan. 22, 2019

(54) SYSTEM AND METHOD FOR IMAGING FOUR-DIMENSIONAL FLOW OF A FLUID WITHIN A VOLUME OF AN IMAGED OBJECT

(71) Applicants: GENERAL ELECTRIC COMPANY, Schenectady, NY (US); THE BOARD OF TRUSTEES OF THE LELAND STANFORD JUNIOR UNIVERSITY, Palo Alto, CA (US)

(72) Inventors: Peng Lai, Menlo Park, CA (US); Joseph Yitan Cheng, Palo Alto, CA (US)

(73) Assignees: General Electric Company, Schenectady, NY (US); The Board of Trustees of the Leland Stanford Junior University, Palo Alto, CA (US)

(*) Notice: Subject to any disclaimer, the term of this patent is extended or adjusted under 35 U.S.C. 154(b) by 358 days.

(21) Appl. No.: 15/135,839

(22) Filed: Apr. 22, 2016

(65) Prior Publication Data
US 2017/0307713 A1    Oct. 26, 2017

(51) Int. Cl.
*G01R 33/48*    (2006.01)
*G01R 33/563*   (2006.01)

(52) U.S. Cl.
CPC .... *G01R 33/56316* (2013.01); *G01R 33/4822* (2013.01)

(58) Field of Classification Search
None
See application file for complete search history.

(56) References Cited

U.S. PATENT DOCUMENTS

| 5,031,624 A | * | 7/1991 | Mistretta | G01R 33/56316 324/306 |
| 6,268,730 B1 | | 7/2001 | Du | |
| 8,022,701 B2 | | 9/2011 | Chen et al. | |
| 9,241,654 B2 | * | 1/2016 | Edelman | A61B 5/055 |
| 9,507,003 B2 | * | 11/2016 | Edelman | G01R 33/5635 |

* cited by examiner

*Primary Examiner* — Paresh H Patel
(74) *Attorney, Agent, or Firm* — Grogan, Tuccillo & Vanderleeden, LLP

(57) ABSTRACT

A method for phase-contrast imaging a fluid within a volume of an imaged subject is provided. The method includes acquiring a plurality of slabs, each slab imaging the fluid flowing within a portion of the volume; and volume merging the plurality of slabs to form an image of the volume. Each slab of the plurality is aligned with respect to the volume such that each slab of the plurality is continuously supplied with a plurality of magnetically unsaturated portions of the fluid during acquisition.

26 Claims, 7 Drawing Sheets

SYSTEM AND METHOD FOR IMAGING FOUR-DIMENSIONAL FLOW OF A FLUID WITHIN A VOLUME OF AN IMAGED OBJECT

BACKGROUND

Technical Field

Embodiments of the invention relate generally to superconducting magnets and, more specifically, to a system and method for imaging four-dimensional flow of a fluid within a volume of an imaged subject.

Discussion of Art

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to impose a strong main magnetic field on the nuclei in the object to be imaged. The nuclei are excited by a radio frequency ("RF") signal at characteristics NMR (Larmor) frequencies. By spatially disturbing localized magnetic fields surrounding the object and analyzing the resulting RF responses from the nuclei as the excited protons relax back to their lower energy normal state, a map or image of these nuclei responses as a function of their spatial location is generated and displayed. An image of the nuclei responses provides a non-invasive view of an object's internal structure.

Some MRI systems can obtain four-dimensional ("4D") images used in volumetric assessment of hemodynamic-related cardiovascular pathologies, i.e., 4D imaging of blood flowing through a region on interest ("ROI") within a patient vessel. Such MRI systems, sometimes also referred to as "Three-Dimensional Phase-Contrast MRI systems", presently use whole-volume acquisition over the ROI. Whole-volume acquisition, however, often saturates the nuclei of imaged blood, which results in a low signal to noise ratio ("SNR"), and typically yields images having low accuracy in flow measurements. Additionally, MRI systems that use free-breathing acquisition in combination with whole-volume acquisition for 4D imaging are highly susceptible to residual motion artifacts. Accordingly, many MRI systems used to obtain 4D images require the use of a contrast agent. The use of a contrast agent, however, may prove problematic for certain procedures performed after injection of the contrast agent, e.g., MRA, perfusion, and LGE, and/or for patients suffering from renal insufficiencies. Moreover, certain countries disfavor the use of contrast agents.

What is needed, therefore, is a system and method for imaging 4D flow of a fluid within a volume of an imaged subject that does not require the use of a contrast agent.

BRIEF DESCRIPTION

In an embodiment, a method for phase-contrast imaging a fluid within a volume of an imaged subject is provided. The method includes acquiring a plurality of slabs, each slab imaging the fluid flowing within a portion of the volume; and volume merging the plurality of slabs to form an image of the volume. Each slab of the plurality is aligned with respect to the volume such that each slab of the plurality is continuously supplied with a plurality of magnetically unsaturated portions of the fluid during acquisition.

In another embodiment, an MRI system for phase-contrast imaging a fluid within a volume of an imaged subject is provided. The MRI system includes a magnet assembly and an MRI controller. The magnet assembly is configured to acquire a plurality of slabs, each slab imaging the fluid flowing within a portion of the volume. The MRI controller is configured to volume merge the plurality of slabs to form an image of the volume. Each slab of the plurality is aligned with respect to the volume such that each slab of the plurality is continuously supplied with a plurality of magnetically unsaturated portions of the fluid during acquisition.

In yet another embodiment, an MRI controller for an MRI imaging system that generates phase-contrast images of the flow of a fluid within a volume of an imaged subject is provided. The MRI controller includes a computer system and an MRI system control. The MRI controller is configured to direct a magnet assembly to acquire a plurality of slabs, each slab imaging the fluid flowing within a portion of the volume; and volume merge the plurality of slabs to form an image of the volume. Each slab of the plurality is aligned with respect to the volume such that each slab of the plurality is continuously supplied with a plurality of magnetically unsaturated portions of the fluid during acquisition.

DRAWINGS

The present invention will be better understood from reading the following description of non-limiting embodiments, with reference to the attached drawings, wherein below:

Figure 1:
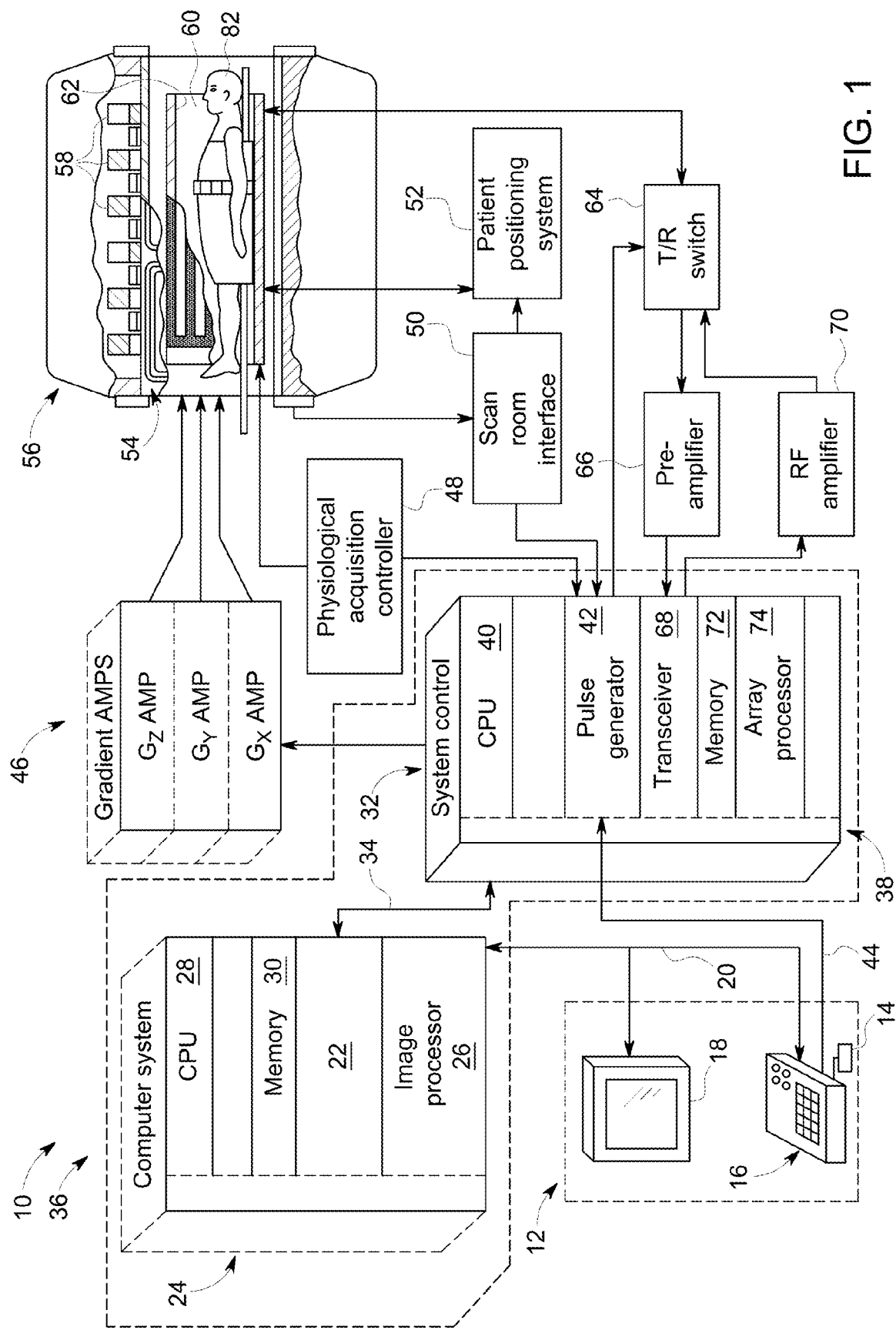
FIG. 1 is a block diagram of an exemplary MRI system in accordance with an embodiment of the invention.
Figure 6:
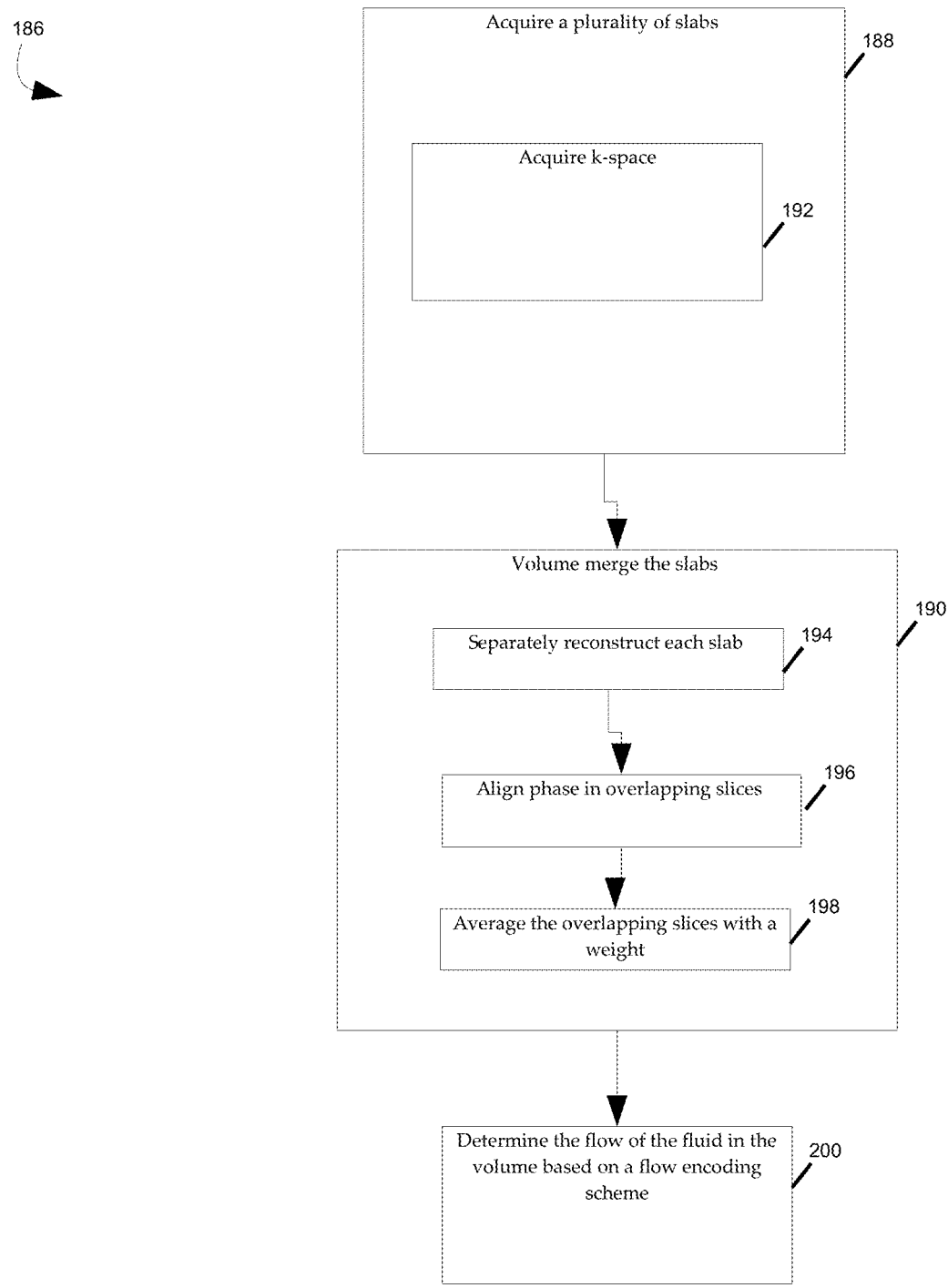
Figure 7A:
Figure 7B:
Figure 7C:
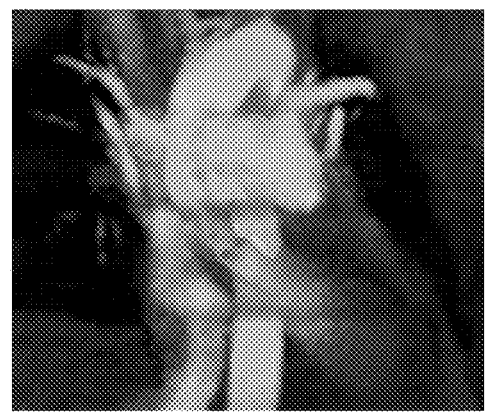

FIG. 6 is a flow chart depicting a method for imaging 4D flow of a fluid within a volume of an imaged subject utilizing the MRI system of FIG. 1 in accordance with an embodiment of the invention; and FIGS. 7A-7C depict a 4D flow image generated by the MRI system of FIG. 1, in accordance with an embodiment of the invention, wherein FIG. 7A is in an axial plane, FIG. 7B is in a sagittal plane, and FIG. 7C is in a coronal plane.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled", "electrically connected", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The terms "downstream" and "upstream" are used herein to refer to the direction of and opposite/against, respectively, a flow path.

Additionally, as used herein: the terms "ramp up" and "ramp down" indicate the processes of injecting and removing current into and from a magnet, respectively; the term "slab" refers to an area of imaging typically used in multiple thin slab acquisition ("MSLAB"); the term "slice" refers to an imaging slice as used in MRI acquisition; and the term "saturation" refers to saturation of a magnetization signal.

Further, while the embodiments disclosed herein are described with respect to an MRI system, it is to be understood that embodiments of the present invention may be applicable to other imaging systems. Further still, as will be appreciated, embodiments of the present invention related imaging systems may be used to analyze animal tissue, and tissue motion generally, and are not limited to human tissue and blood flow.

Referring to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data is rearranged into separate k-space data arrays for each image to be reconstructed, and each of these is input to an array processor 74 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
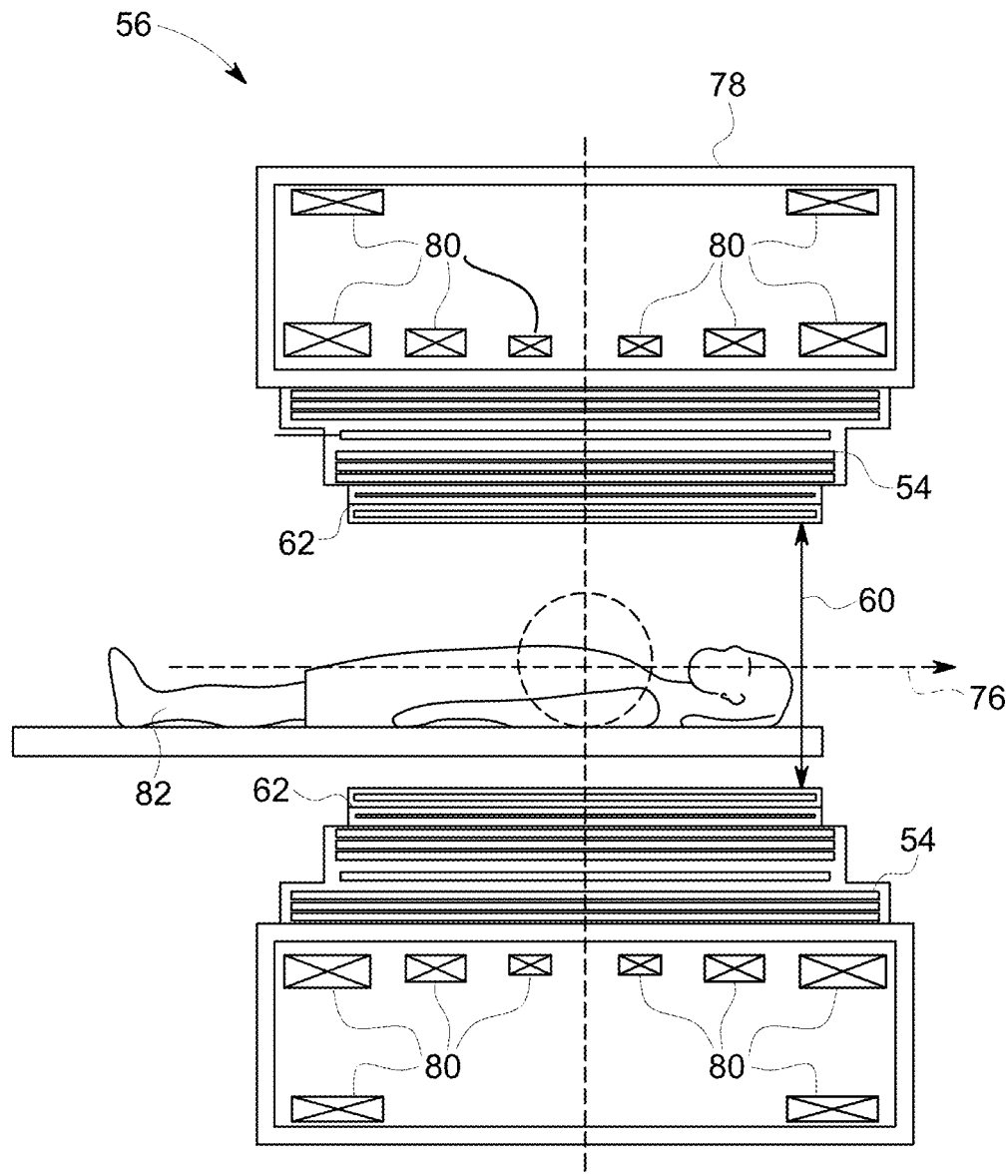
FIG. 2 is a schematic cross-sectional view of a magnet assembly of the MRI system of FIG. 1.

Referring now to FIG. 2, a schematic side elevation view of the magnet assembly 56 is shown in accordance with an embodiment of the invention. The magnet assembly 56 is cylindrical in shape having a center axis 76. The magnet assembly 56 includes a cryostat 78 and one or more radially aligned longitudinally spaced apart superconductive coils 80. The superconductive coils 80 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 78 in order to help insulate the cryostat 78 from heat generated by the rest of the MRI system (10 in FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 82 is inserted into the magnet assembly 56.

Figure 3:
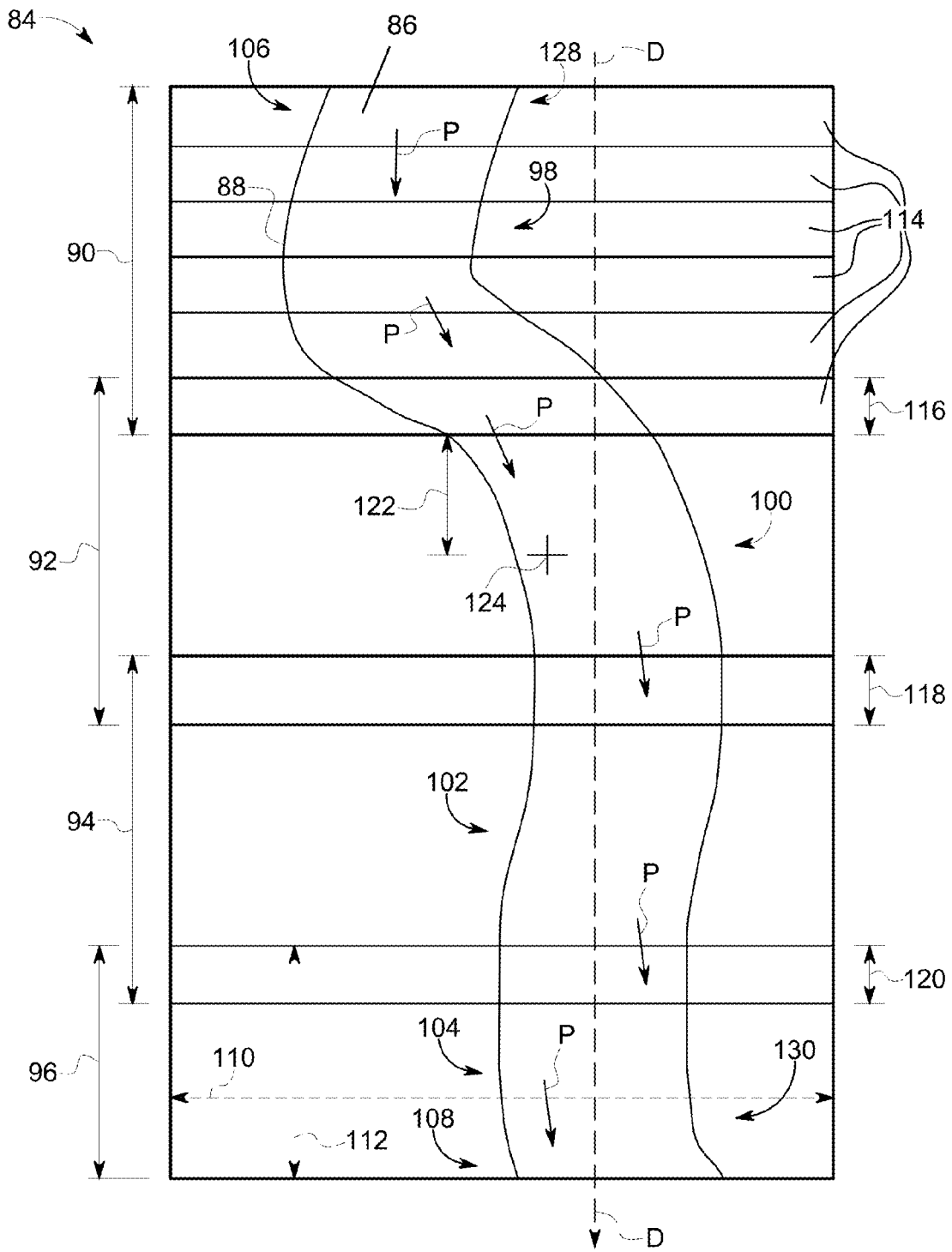
FIG. 3 is a diagram of a 4D flow image acquired via the MRI system of FIG. 1, wherein the outlines of a plurality of slabs merged to produce the 4D image are depicted in accordance with an embodiment of the invention.

Turning now to FIG. 3, in embodiments, the MRI system 10 may be configured to generate one or more 4D and/or phase-contrast images 84 of the flow of a fluid 86, flowing in path P, within a volume 88 of an imaged subject 82. In such embodiments, the MRI system 10 may utilize MSLAB in which the volume 88 is partitioned into a plurality of slabs 90, 92, 94, 96, each slab 90, 92, 94, 96 imaging the fluid 86 flowing within a portion 98, 100, 102, 104 of the volume 88. While FIG. 3 depicts volume 88 as a two-dimensional ("2D") structure, it is to be understood that volume 88 is in fact a three-dimensional ("3D") structure. Additionally, embodiments of the invention may employ multiple overlapping thin slab acquisition ("MOTSA") and/or SLINKY protocols. Once the slabs 90, 92, 94, 96 have been acquired, the MRI system 10 may then volume merge the slabs 90, 92, 94, 96 to form/generate the image 84.

As shown in FIG. 3, each slab 90, 92, 94, 96 is aligned with respect to the volume 88 such that each slab 90, 92, 94, 96 is continuously supplied with a plurality of magnetically unsaturated portions (shown generally as 106) of the fluid 86 during acquisition, herein after also refereed to simply as unsaturated fluid 106. As is to be appreciated, the unsaturated fluid 106 becomes saturated (shown generally as 108) as it is imaged within a slab 90, 92, 94, 96 by the MRI system 10. As stated above, saturated fluid 108 may reduce the quality of the resulting image 84. Thus, the continuous supply of unsaturated fluid 106 to the slabs 90, 92, 94, 96 during acquisition increases the SNR and reduces the sensitivity to residual motion artifacts of the MRI system 10. In other words, the slabs 90, 92, 94, 96 are oriented with respect to the volume 88 such that unsaturated fluid 106 flows into the slabs 90, 92, 94, 96 while saturated fluid 108 flows out of the slabs 90, 92, 94, 96. Therefore, in embodiments, there may be more unsaturated fluid 106 than saturated fluid 108 in a given slab 90, 92, 94, 96 during imaging/acquisition by the MRI system 10. Accordingly, and as is to be appreciated, some embodiments of the invention reduce and/or eliminate the need for a contrast agent.

As further shown in FIG. 3, each slab 90, 92, 94, 96 may have a longitudinal axis 110, a thickness 112, and include one or more slices 114, 116, 118, 120 each having an off-slab-center distance 122. As used herein, the term "off-slab-center distance" refers to the distance 122 between a given slice 116 and a center 124 of the slab 92 of which the slice 116 is included in. Further, in embodiments, the one or more slabs 90, 92, 94, 96 may share overlapping slices 116, 118, 120. For example, as shown in FIG. 3, slabs 90 and 92 share slice 116, slabs 92 and 94 share slice 118, and slabs 94 and 96 share slice 120. Further, while only the non-overlapping slices 114 of slab 90 and the overlapping slices 116, 118, and 120 have been shown for the purpose of clarity, it is to be understood that slabs 92, 94, and 96 may include non-overlapping slices 114 in the same manner as slab 90. Further still, while the slices 114, 116, 118, 120 are shown in 2D, it is to be understood that the slices 114, 116, 118, 120 are in reality 3D with 3D orientations within their respective slabs. Yet further, while FIG. 3 depicts an embodiment utilizing four slabs, 90, 92, 94, 96, other embodiments may utilize additional and/or fewer numbers of slabs, e.g., three slabs.

As stated above, the fluid 86 may become saturated during acquisition of the slabs 90, 92, 94, 96 by the MRI system 10. As also stated above, each slab 90, 92, 94, 96 may be aligned with respect to the volume 88 such that each slab 90, 92, 94, 96 is continuously supplied with unsaturated fluid 106. As it happens to be, however, the flow of the fluid 86 within the volume 88 may not be uniform in direction, velocity, and/or volume, e.g., the flow of the fluid 86 may form back currents, eddies, swirls, etc. Fortunately, it is often the case that a general flow direction D of the fluid 86 may be ascertainable, e.g., in the direction of a superior 128 to an inferior 130 ("SI") in a blood pool and/or vessel of interest, e.g., intra-ventricular flow and flow along the aorta and main pulmonary arteries. For example, in embodiments, the imaged fluid 86 may be blood flowing within a cardiac chamber 88 of a patient (82 in FIGS. 1 and 2) having a general general flow direction D.

Accordingly, in embodiments, the slabs 90, 92, 94, 96 may be aligned with respect to the volume 88 such that the flow direction D intercepts the slabs 90, 92, 94, 96 so as to maximize the flux of the fluid 86 across the slabs 90, 92, 94, 96. As such, in embodiments, the slabs 90, 92, 94, 96 may be aligned with respect to the volume 88 such that each slab 90, 92, 94, 96 is substantially perpendicular to the flow direction D. It is to be understood, however, that other orientations/alignments of the slabs 90, 92, 94, 96 with respect to the volume 88 may be used. As is to be appreciated, maximizing the flux of the fluid 86 across the slabs 90, 92, 94, 96 increases the amount of unsaturated fluid 106, as compared to saturated fluid 108, within a particular slab 90, 92, 94, 96 during acquisition which in turn increases the quality of the resulting image 84.

Further, the proportion of unsaturated 106 to saturated 108 fluid within the slabs 90, 92, 94, 96 may also be adjusted by adjusting the thickness 112 of the slabs 90, 92, 94, 96. In particular, the thinner the slabs 90, 92, 94, 96, the less amount of time the fluid 86 spends within a given slab during imaging. As such, in embodiments, the smaller the thickness 112 of the slabs 90, 92, 94, 96, the greater the proportion of unsaturated 106 to saturated 108 fluid within a particular slab 90, 92, 94, 96 during acquisition; i.e., the thinner the slabs 90, 92, 94, 96, the better the quality of the resulting image 84.

Additionally, the order in which the slabs 90, 92, 94, 96 are acquired by the MRI system 10 can be manipulated. For example, in embodiments, the MRI system 10 may acquire the slabs 90, 92, 94, 96 from the most inferior 130 to the most superior 128, i.e., in the upstream direction of the flow direction D. For example, in the image 84 shown in FIG. 3, slab 90 may be the most superior slab, i.e., the most upstream slab with respect to the flow of the fluid 86 along path P in direction D, and slab 96 may be the most inferior slab, i.e., the most downstream slab with respect to the flow of the fluid 86 along path P in direction D. Accordingly, slab 96 may be acquired first, flowed by slab 94, then slab 92, and finally slab 90. It is to be appreciated, however, that in other embodiments, the slabs 90, 92, 94, 96 may be acquired in other orders. For example, the slabs can be acquired in an interleaved fashion, e.g., in an order of 90, 94, 92 and 96.

Figure 4:
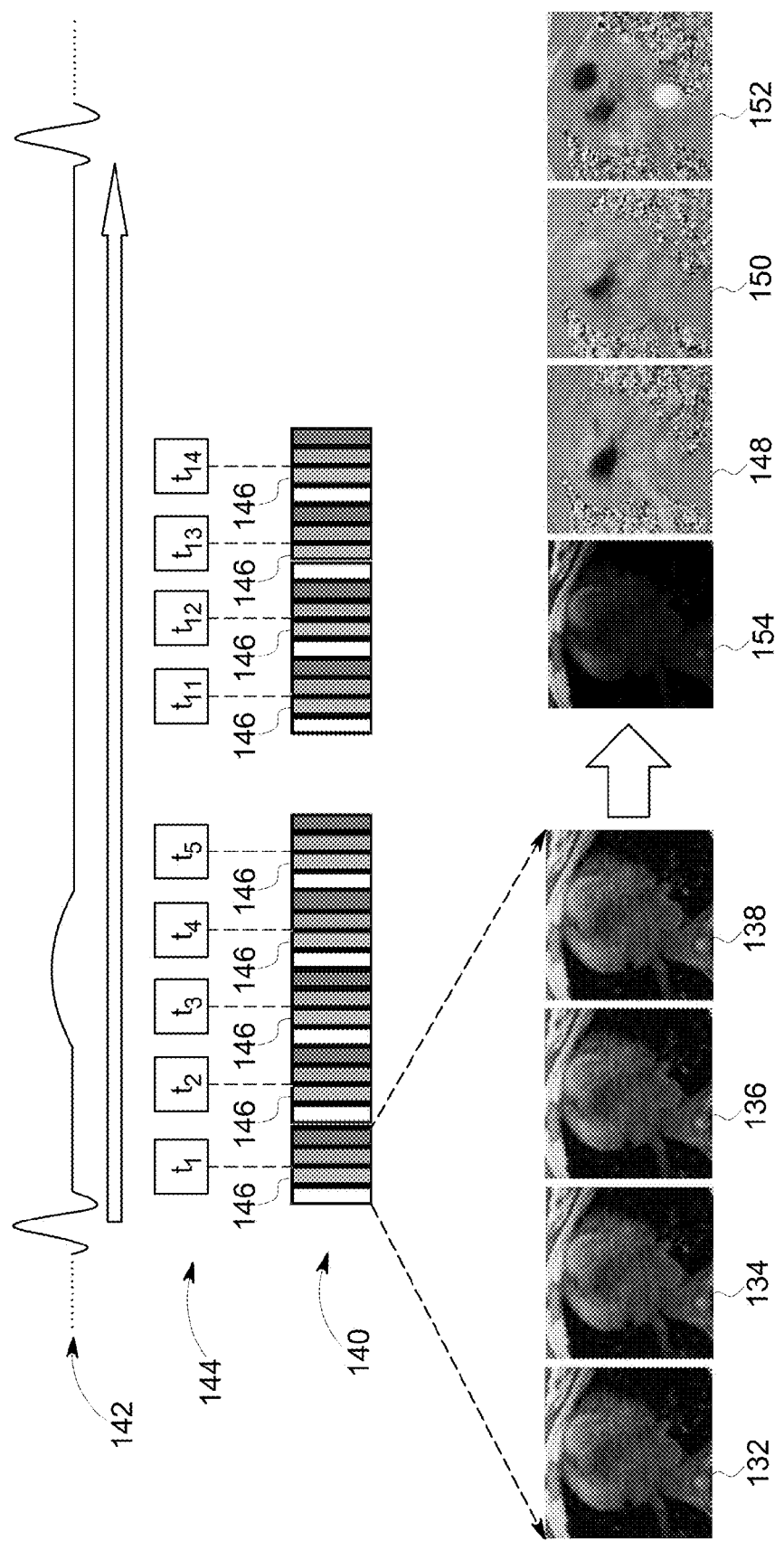
FIG. 4 is a diagram that depicts the acquisition of echoes by the MRI system of FIG. 1 during a cardiac cycle in accordance with an embodiment of the invention.

Moving now to FIG. 4, in embodiments, each slab 90, 92, 94, 96 may be based on a plurality of echoes 132, 134, 136, 138 that form part of a flow encoding protocol 140. As stated above, embodiments of the MRI system 10 may be configured to measure the flow of blood within a vessel and/or the cardiac chamber of a patient. Such embodiments may follow a flow-encoding scheme or protocol 140 in which the echoes 132, 134, 136, 138 are acquired during one or more cardiac cycles 142. As shown in FIG. 4, the encoding protocol 140 may partition the cardiac cycle 142 into a plurality of phases 144, represented herein as time windows ti through $t_{14}$.

While FIG. 4 depicts time windows only through $t_{14}$, embodiments may contain additional or fewer numbers of time windows, wherein the number of time windows is sufficient to cover the beginning through the end of the cardiac cycle 142. The encoding protocol may dictate that one or more echoes 132, 134, 136, 138 are acquired by the MRI system 10 during each phase 144/time window. For example, as shown in FIG. 4, the MRI system 10 may acquire four (4) echoes 132, 134, 136, 138 at each time window throughout the entire cardiac cycle. In embodiments, the echoes 132, 134, 136, 138 within a given time window may be taken at a rate of 5 ms, and the time windows ti through $t_{14}$ may be spaced apart by 60 ms.

As is to be appreciated, the set of echoes 132, 134, 136, 138 taken during a single time window, e.g., ti, may form a set of complex echo images 146 from which various information concerning the fluid 86 within the volume 88 can be determined. For example, in embodiments, the flow encoding protocol 140 may result in four complex echo images 132, 134, 136, 138 from which the flow of the fluid 86 in a slab 90, 92, 94, 96 can be calculated from by comparing phase differences between one or more of the echoes 132, 134, 136, 138 forming the complex echo images 146, e.g., the flow along a particular direction within a slab 90, 92, 94, 96 may be calculated as a linear combination of the phase differences across one or more of the echo images 132, 134, 136, 138 contained within a set of complex echo images 146 corresponding to the slab 90, 92, 94, 96. In embodiments, the flow of the fluid 86 in a slab 90, 92, 94, 96 may be determined/calculated by phase differences from one echo image 132, 134, 136, 138 to the next 132, 134, 136, 138. As further shown in FIG. 4, in embodiments, images 148, 150, 152 may be generated based on the phase difference across the echoes 132, 134, 136, 138 such that blood flow is depicted in three directions, and a further image 154 may be generated based on a magnitude of the set of complex echo images 146 such that an anatomy of the subject 82/volume 88 is depicted. In particular, in embodiments, the contrast of blood resulting from a comparison of phase differences may be highest in flow images 148, 150, 152 obtained at cardiac phases/time windows 144 having a peak blood flow.

Further, in embodiments, a difference of the complex signal from the echoes 132, 134, 136, 138 or a subset of these echoes may be computed. As is to be understood, the magnitude of such a complex difference may be dependent on the velocity of the blood flow, and thus, may be used to highlight and visualize vessels with flowing blood. In such embodiments, this computation may be performed before merging the slabs, or alternatively, may be performed after merging the phase-aligned slabs.

As it to be further appreciated, the information contained within the echoes 132, 134, 136, 138 may be used to fill k-space. As such, embodiments of the invention may fill/acquire k-space with a Cartesian radial or spiral view-order in ky-kz using one or more golden angle increments. Embodiments of the invention may also fill/acquire k-space with a non-Cartesian trajectory, e.g., radial or spiral trajectory. As is to be appreciated, such acquisition schemes revisit central k-space repeatedly during the acquisition of each slab 90, 92, 94, 96. As such, in embodiments, the effect of any heart-rate variation or respiratory drift is spread in the entire k-space of each slab 90, 92, 94, 96 and propagates smoothly across the slabs 90, 92, 94, 96. As stated above, the acquisition of slabs 90, 92, 94, and 96 may be interleaved. Thus, in such embodiments, the acquisition of k-space of slab 90, 92, 94, 96 may also be interleaved during the scan, as opposed to acquired sequentially. For example, acquisition of slab 90, 92, 94, 96 can be interleaved in consecutive cardiac cycles 142, with a first cardiac cycle 142 collecting k-space for slab 90, a second cardiac cycle 142 collecting k-space for slab 94, a third cardiac cycle 142 collecting k-space for slab 92, and a fourth cardiac cycle 142 collecting k-space for slab 96. As is to be understood, the above acquisition order may be repeated till the end of the scan. As such, in embodiments, the effect of heart rate variations or respiratory drift is modulated in each slab 90, 92, 94, 96 similarly, and anatomy and/or flow misregistration is minimized from one slab to the next. Furthermore, embodiments with the aforementioned slab-interleaved acquisition may provide for longer magnetization recovery times for one or more of the slabs 90, 92, 94, 96, therefore further improving the blood signal.

As stated above, once the slabs 90, 92, 94, 96 have been acquired, the MRI system 10 may then volume merge the slabs 90, 92, 94, 96 to form/generate the image 84. As such, embodiments of the invention may separately reconstruct each slab 90, 92, 94, 96 during the volume merging process. For example, each slab 90, 92, 94, 96 may be individually reconstructed using ARC—a auto-calibrating parallel imaging method, or kat ARC—a k-t auto-calibrating parallel imaging method with cardiac motion adaptive temporal window selection.

In embodiments, the volume merging process may include averaging the overlapping slices 116, 118, 120 with a weight that is based at least in part on the off-slab-center distances 122 of at least one of the overlapping slices 116, 118, 120. Because multiple acquisitions of an overlapping slice may be subject to different phase modulation from acquisition, direct volume merging may produce significant signal cancellation and therefore reduce the accuracy of the flow images in overlapping slices (indicated by arrows in image set 156 in FIG. 5). The volume merging process may include phase alignment of a complex signal from multiple acquisitions in the overlapping slices before averaging to minimize signal cancellation. Such phase alignment involves calculating phase shifts for multiple acquisitions at the same spatial location in overlapping slices and then aligning the complex signal in echo images 132, 134, 136, 138 from each of the multiple acquisitions using the same phase shift.

Accordingly, in embodiments, such phase shift can be calculated using a least squares error fitting of the complex signals from multiple acquisitions at the same spatial location. For example, let one acquisition at a spatial location in an overlapping slice in echo images 132, 134, 136, 138 be $d_1, d_2, d_3$ and $d_4$, respectively, and a second acquisition at the same spatial location be $e_1, e_2, e_3$ and $e_4$, respectively. The phase shift to align the second acquisition to the first acquisition can be calculated as the angle of $E^H D$, where E is a column vector comprised of $e_1, e_2, e_3$ and $e_4$ (E=[$e_1, e_2, e_3, e_4$]), D is a column vector comprised of $d_1, d_2, d_3$ and $e_4$ (D=[$d_1, d_2, d_3, d_4$]), and H is a conjugate transpose operator.

In embodiments, the phase shift can be calculated by the inverse phase in a reference echo image selected from one of echo images 132, 134, 136, 138. For example, the first echo image 132 may be selected as the reference echo and the phase of the first echo image 132 is demodulated from echo images 132, 134, 136, 138. In such embodiments, the phase demodulation may be performed separately in each of the multiple acquisitions in an overlapping slice. Such phase alignment substantially reduces the signal cancellation in volume merging and improves signal-to-noise ratio in the overlapping slices. Moreover, such phase alignment, in which the same phase shift is applied across echo images 132, 134, 136, 138, preserves phase differences in echo images 132, 134, 136, 138. Thus, as will be appreciated, such phase alignment may not impact flow measurement based on phase contrast.

Additionally, in embodiments, volume merging may include performing phase contrast in each of slab 90, 92, 94, 96 first to calculate flow images 148, 150, 152 in each of slab 90, 92, 94, 96, and then merging overlapping slices on the flow images. In such embodiments, because the phase modulation in the original echo images 132, 134, 136, 138 may already be removed in the phase contrast processing, no additional phase alignment may be needed before volume merging. The volume merging in such embodiments may involve averaging with a weight based at least in part on the off-slab-center distances 122 of at least one of the overlapping slices 116, 118, 120, similar to the previous embodiments above. Alternatively, the volume merging of flow images 148 150, 152 may involve averaging with a weight based on the signal intensity of the magnitude image 154 of at least one of the overlapping slices 116, 118, 120.

In other embodiments, the volume merging process may include the phase and magnitude of a slab profile. Because the RF excitation pulse is known, the phase and magnitude of a slab profile can be derived from simulations. Alternatively, the phase and magnitude of a slab profile may be measured using a calibration scan. The phase information may be used to align the phase of the multiple slabs 90, 92, 94, 96. For example, in embodiments, the magnitude information may be used to compute weights for a weighted linear combination of the different slabs 90, 92, 94, 96. Alternatively, the phase information from the slab profile can be used to first partially align the multiple slabs 90, 92, 94, 96, and the least square error fitting can be used to reduce residual phase errors.

Figure 5:
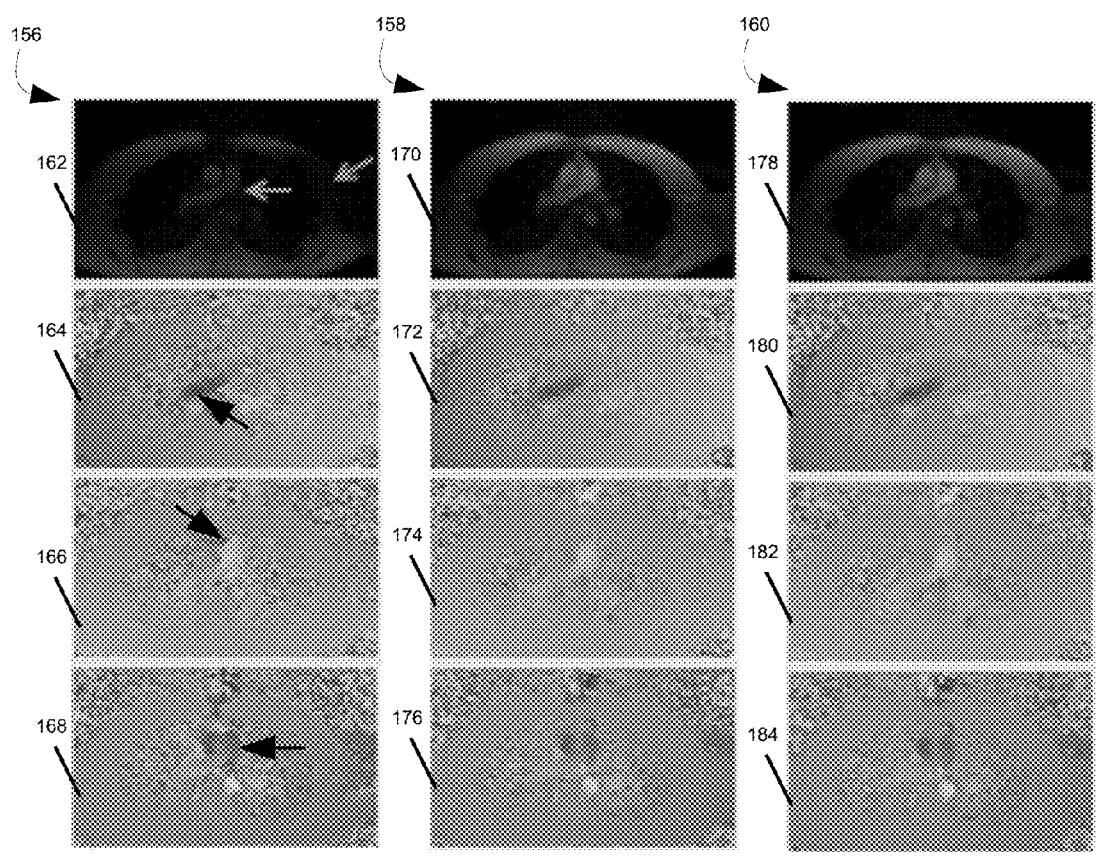
FIG. 5 depicts three sets of images at an overlapping location after volume merging by the MRI system of FIG. 1, wherein two of the sets of images incorporate phase alignment in accordance with embodiments of the invention.

Accordingly, and as illustrated in FIG. 5, the improvements of phase alignment based on a least squares error fitting and demodulating phase in a reference echo image can be seen across the three shown sets of images 156, 158, and 160. As is to be understood, set 156 includes images 162, 164, 166, and 168, set 158 includes images 170, 172, 174, and 176, and set 160 includes images 178, 180, 182, and 184. As is to be further understood, magnitude/anatomy images 162, 170, and 178 correspond to image 154 (FIG. 4); left-right flow images 164, 172, and 180 correspond to image 148 (FIG. 4); anterior-posterior flow images 166, 174, and 182 correspond to image 150 (FIGS. 4); and superior-inferior flow images 168, 176, and 184 correspond to image 152 (FIG. 4).

Referring now to FIG. 6, a method 186 for imaging 4D flow of the fluid 86 within the volume 88 of the imaged subject 82 utilizing the MRI system 10 according to an embodiment is shown. As will be appreciated, in certain embodiments, an imaging application may be stored in the memory device 30, 72 which may be loaded into the CPU 28, 40 such that the MRI controller 36 is adapted by the imaging application to perform all, or part, of method 186. Accordingly, as shown in FIG. 6, the method 186 includes acquiring 188 a plurality of slabs 90, 92, 94, 96 and volume merging 190 the slabs 90, 92, 94, 96 to form an image 84. In embodiments, acquiring 188 the slabs 90, 92, 94, 96 may include acquiring 192 k-space with a Cartesian radial or spiral view-order in ky-kz using one or more golden angle increments, or a non-Cartesian trajectory, or a slab-interleave acquisition scheme. In embodiments, volume merging 190 the slabs may include separately reconstructing 194 each slab 90, 92, 94, 96. In embodiments in which two or more slabs 90, 92, 94, 96 have overlapping slices 116, 118, 120, volume merging 190 the slabs 90, 92, 94, 96 may include aligning 196 phase in multiple acquisitions of overlapping slices 116, 118, 120 and then averaging 198 the overlapping slices 116, 118, 120 with a weight in the manner described above. In embodiments, the method 186 may further include determining 200 the flow of the fluid 86 in the volume 88 based on a flow encoding protocol 140 which compares phases differences between one or more of the echoes 132, 134, 136, 138.

Referring now to FIGS. 7A-7C, images produced by an MRI system 10 in accordance with the embodiments disclosed herein are shown. In particular, FIG. 7A depicts an axial slice, FIG. 7B depicts the flow of blood at an aorta reformat, and FIG. 7C depicts a 5 cm coronal MIP. As is to be understood, the images depicted in FIGS. 7A-7C are based on an embodiment of the MRI system 10 which uses four (4) slabs with four (4) overlapping slices, wherein each slab has twenty (20) slices acquired over approximately 2.5 minutes/slab, as well as the following additional parameters: 380×260 mm2 FOV; 2.2×2.2 mm2 resolution; 2.4 mm slice thickness; VPS of 3; 8× acceleration.

Finally, it is also to be understood that the MRI system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the MRI system 10 may include at least one processor 28, 40 and system memory 30, 72, which may include random access memory (RAM) and read-only memory (ROM). The MRI system 10 may further include an input/output controller, and one or more data storage structures. All of these latter elements may be in communication with the at least one processor 28, 40 to facilitate the operation of the MRI system 10 as discussed above. Suitable computer program code may be provided for executing numerous functions, including those discussed above in connection with the MRI system 10 and methods disclosed herein. The computer program code may also include program elements such as an operating system, a database management system and "device drivers" that allow the MRI system 10, to interface with computer peripheral devices, e.g., sensors, a video display, a keyboard, a computer mouse, etc.

The at least one processor 28, 40 of the MRI system 10 may include one or more conventional microprocessors and one or more supplementary co-processors such as math co-processors or the like. Elements in communication with each other need not be continually signaling or transmitting to each other. On the contrary, such elements may transmit to each other as necessary, may refrain from exchanging data at certain times, and may cause several steps to be performed to establish a communication link there-between.

The data storage structures such as memory discussed herein may include an appropriate combination of magnetic, optical and/or semiconductor memory, and may include, for example, RAM, ROM, flash drive, an optical disc such as a compact disc and/or a hard disk or drive. The data storage structures may store, for example, information required by the MRI system 10 and/or one or more programs, e.g., computer program code such as the imaging application and/or other computer program product, adapted to direct the MRI system 10. The programs may be stored, for example, in a compressed, an uncompiled and/or an encrypted format, and may include computer program code. The instructions of the computer program code may be read into a main memory of a processor from a computer-readable medium. While execution of sequences of instructions in the program causes the processor to perform the process steps described herein, hard-wired circuitry may be used in place of, or in combination with, software instructions for implementation of the processes of the present invention. Therefore, embodiments of the present invention are not limited to any specific combination of hardware and software.

The program may also be implemented in programmable hardware devices such as field programmable gate arrays, programmable array logic, programmable logic devices or the like. Programs may also be implemented in software for execution by various types of computer processors. A program of executable code may, for instance, includes one or more physical or logical blocks of computer instructions, which may, for instance, be organized as an object, procedure, process or function. Nevertheless, the executables of an identified program need not be physically located together, but may include separate instructions stored in different locations which, when joined logically together, form the program and achieve the stated purpose for the programs such as preserving privacy by executing the plurality of random operations. In an embodiment, an application of executable code may be a compilation of many instructions, and may even be distributed over several different code partitions or segments, among different programs, and across several devices.

The term "computer-readable medium" as used herein refers to any medium that provides or participates in providing instructions to at least one processor 28, 40 of the MRI system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

Various forms of computer readable media may be involved in carrying one or more sequences of one or more instructions to at least one processor for execution. For example, the instructions may initially be borne on a magnetic disk of a remote computer (not shown). The remote computer can load the instructions into its dynamic memory and send the instructions over an Ethernet connection, cable line, or telephone line using a modem. A communications device local to a computing device, e.g., a server, can receive the data on the respective communications line and place the data on a system bus for at least one processor. The system bus carries the data to main memory, from which the at least one processor retrieves and executes the instructions. The instructions received by main memory may optionally be stored in memory either before or after execution by the at least one processor. In addition, instructions may be received via a communication port as electrical, electromagnetic or optical signals, which are exemplary forms of wireless communications or data streams that carry various types of information.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a method for phase-contrast imaging a fluid within a volume of an imaged subject is provided. The method includes acquiring a plurality of slabs, each slab imaging the fluid flowing within a portion of the volume; and volume merging the plurality of slabs to form an image of the volume. Each slab of the plurality is aligned with respect to the volume such that each slab of the plurality is continuously supplied with a plurality of magnetically unsaturated portions of the fluid during acquisition. In certain embodiments, the image is acquired without the use of a contrast agent. In certain embodiments, the image is acquired with or without the use of a contrast agent. In certain embodiments, the image is of a four-dimensional flow of the fluid within the volume. In certain embodiments, acquiring a plurality of slabs, each slab imaging the fluid flowing within a portion of the volume, includes: acquiring a k-space with a Cartesian radial or a spiral view-order in ky-kz; acquiring a k-space with a non-Cartesian k-space trajectory; or acquiring a k-space with a slab-interleaved data acquisition. In certain embodiments, volume merging the slabs to form an image of the volume includes separately reconstructing each slab of the plurality. In certain embodiments, each slab of the plurality comprises one or more slices each having a phase modulation and an off-slab-center distance; one or more of the slabs share overlapping slices. In such embodiments volume merging the slabs to form an image of the volume includes: phase aligning the overlapping slices at a location within the overlapping slices using a phase shift common across one or more echo images of a slab of the one or more slabs sharing the overlapping slices; and averaging the overlapping slices with a weight that is based at least in part on the off-slab-center distance of at least one of the overlapping slices. In certain embodiments, averaging the overlapping slices with a weight that is based at least in part on the off-slab-center distance of at least one of the overlapping slices is based at least in part on a magnitude of a slab excitation profile. In certain embodiments, averaging the overlapping slices with a weight is based at least in part on the off-slab-center distance of at least one of the overlapping slices, based at least in part on a magnitude of a slab excitation profile, or based at least in part on a signal in a magnitude image of at least one of the overlapping slices. In certain embodiments, each slab of the plurality includes one or more slices each having a phase modulation and an off-slab-center distance. In such embodiments one or more of the slabs share overlapping slices and volume merging the slabs to form an image of the volume includes: phase contrasting each slab to calculate a flow of the fluid; and averaging the overlapping slices with a weight that is based at least in part on the off-slab-center distance of at least one of the overlapping slices or based at least in part on a signal in a magnitude image of at least one of the overlapping slices. In certain embodiments, each slab of the plurality is based at least in part on a plurality of echoes; and the method further includes determining the flow of the fluid in each slab, or the volume, based on a flow encoding protocol that compares a phase difference between one or more of the echoes. In certain embodiments, each slab of the plurality is further aligned with respect to the volume such that each slab is substantially perpendicular to a flow direction of the fluid.

Other embodiments provide for an MRI system for phase-contrast imaging a fluid within a volume of an imaged subject. The MRI system includes a magnet assembly and an MRI controller. The magnet assembly is configured to acquire a plurality of slabs, each slab imaging the fluid flowing within a portion of the volume. The MRI controller is configured to volume merge the plurality of slabs to form an image of the volume. Each slab of the plurality is aligned with respect to the volume such that each slab of the plurality is continuously supplied with a plurality of magnetically unsaturated portions of the fluid during acquisition. In certain embodiments, the plurality of slabs is based at least in part on a k-space acquired with: a Cartesian radial or a spiral view-order in ky-kz; a non-Cartesian trajectory; or a slab-interleaved acquisition. In certain embodiments, each slab of the plurality is separately reconstructed when the MRI controller volume merges the slabs. In certain embodiments, each slab of the plurality comprises one or more slices each having a phase modulation and an off-slab-center distance. One or more of the slabs share overlapping slices. The overlapping slices are phase aligned at a location within the overlapping slices using a phase shift common across one or more echo images of a slab of the one or more slabs sharing the overlapping slices. The overlapping slices are averaged with a weight that is based at least in part on the off-slab-center distance of at least one of the overlapping slices when the MRI controller volume merges the slabs. In certain embodiments, each slab of the plurality includes one or more slices each having a phase modulation and an off-slab-center distance. One or more of the slabs share overlapping slices. Each slab is processed with a phase contrast to calculate a flow of the fluid. The overlapping slices are averaged with a weight that is based at least in part on the off-slab-center distance of at least one of the overlapping slices or based at least in part on a signal in a magnitude image of at least one of the overlapping slices when the MRI controller volume merges the slabs. In certain embodiments, the weight is further based at least in part on a magnitude of a slab excitation profile. In certain embodiments, each slab of the plurality is based at least in part on a plurality of echoes. In such embodiments, the MRI controller is further configured to determine the flow of the fluid in each slab, or the volume, based on a flow encoding protocol that compares a phase difference between one or more of the echoes. In certain embodiments, each slab of the plurality is further aligned with respect to the volume such that each slab is substantially perpendicular to a flow direction of the fluid.

Yet still other embodiments provide for an MRI controller for an MRI imaging system that generates phase-contrast images of the flow of a fluid within a volume of an imaged subject. The MRI controller includes a computer system and an MRI system control. The MRI controller is configured to direct a magnet assembly to acquire a plurality of slabs, each slab imaging the fluid flowing within a portion of the volume; and volume merge the plurality of slabs to form an image of the volume. Each slab of the plurality is aligned with respect to the volume such that each slab of the plurality is continuously supplied with a plurality of magnetically unsaturated portions of the fluid during acquisition. In certain embodiments, the plurality of slabs is based at least in part on a k-space acquired with: a Cartesian radial or spiral view-order in ky-kz; a non-Cartesian trajectory; or a slab-interleaved acquisition. In certain embodiments, each slab of the plurality is separately reconstructed when the MRI controller volume merges the plurality of slabs. In certain embodiments, each slab of the plurality comprises one or more slices each having a phase modulation and an off-slab-center distance. One or more of the slabs share overlapping slices. The overlapping slices are phase aligned at a location within the overlapping slices using a phase shift common across one or more echo images of a slab of the one or more slabs sharing the overlapping slices. The overlapping slices are averaged with a weight that is based at least in part on the off-slab-center distance of at least one of the overlapping slices when the MRI controller volume merges the slabs. In certain embodiments, each slab of the plurality includes one or more slices each having a phase modulation and an off-slab-center distance. One or more slabs share overlapping slices. Each slab is processed with a phase contrast to calculate a flow of the fluid. The overlapping slices are averaged with a weight that is based at least in part on the off-slab-center distance of at least one of the overlapping slices or based at least in part on a signal in a magnitude image of at least one of the overlapping slices when the MRI controller volume merges the slabs. In certain embodiments, the weight is further based at least in part on a magnitude of a slab excitation profile. In certain embodiments, each slab of the plurality is based at least in part on a plurality of echoes. In such embodiments, the MRI controller is further configured to determine the flow of the fluid in each slab, or the volume, based on a flow encoding protocol that compares a phase difference between one or more of the echoes. In certain embodiments, each slab of the plurality is further aligned with respect to the volume such that each slab is substantially perpendicular to a flow direction of the fluid.

Accordingly, as will be appreciated, by using multiple slabs aligned such that each slab is continuously supplied with unsaturated fluid during acquisition of the slab, some embodiments of the present invention are able to produce images sufficient for medical diagnosis without the use of a contrast agent. Therefore, some embodiments of the invention provide for a 4D Flow MRI system, which can be used to image patients having renal issues, e.g., kidney failure. Moreover, unlike present 4D flow MRI systems that typically acquire k-space via linear view orders, which often results in misregistration in volume merging, some embodiments of the invention acquire k-space via a Cartesian radial or spiral view-order in ky-kz using golden angle increments or a non-Cartesian trajectory, which provides for a smooth cross-slab modulation, or via a slab-interleaved acquisition scheme, which generates similar cross-slab modulation. As such, some embodiments ensure continuous anatomy and flow within the generated images after volume merging the slabs.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A method for phase-contrast imaging a fluid within a volume of an imaged subject comprising:
   acquiring a plurality of slabs, each slab imaging the fluid flowing within a portion of the volume; and
   volume merging the plurality of slabs to form an image of the volume;
   wherein each slab of the plurality is aligned with respect to the volume such that each slab of the plurality is continuously supplied with a plurality of magnetically unsaturated portions of the fluid during acquisition.

2. The method of claim 1, wherein the image is acquired without the use of a contrast agent.

3. The method of claim 1, wherein the image is of a four-dimensional flow of the fluid within the volume.

4. The method of claim 1, wherein acquiring a plurality of slabs, each slab imaging the fluid flowing within a portion of the volume, comprises:
   acquiring a k-space with a Cartesian radial or a spiral view-order in ky-kz;
   acquiring a k-space with a non-Cartesian k-space trajectory; or
   acquiring a k-space with a slab-interleaved data acquisition.

5. The method of claim 1, wherein volume merging the slabs to form an image of the volume comprises:
   separately reconstructing each slab of the plurality.

6. The method of claim 1, wherein
   each slab of the plurality comprises one or more slices each having a phase modulation and an off-slab-center distance;
   one or more of the slabs share overlapping slices; and
   volume merging the slabs to form an image of the volume comprises:
      phase aligning the overlapping slices at a location within the overlapping slices using a phase shift common across one or more echo images of a slab of the one or more slabs sharing the overlapping slices; and
      averaging the overlapping slices with a weight that is based at least in part on the off-slab-center distance of at least one of the overlapping slices.

7. The method of claim 6, wherein averaging the overlapping slices with a weight that is based at least in part on the off-slab-center distance of at least one of the overlapping slices is based at least in part on a magnitude of a slab excitation profile.

8. The method of claim 1, wherein
   each slab of the plurality comprises one or more slices each having a phase modulation and an off-slab-center distance;
   one or more of the slabs share overlapping slices; and
   volume merging the slabs to form an image of the volume comprises:
      phase contrasting each slab to calculate a flow of the fluid; and
      averaging the overlapping slices with a weight that is based at least in part on the off-slab-center distance of at least one of the overlapping slices or based at least in part on a signal in a magnitude image of at least one of the overlapping slices.

9. The method of claim 1, wherein each slab of the plurality is based at least in part on a plurality of echoes; and the method further comprises:
   determining the flow of the fluid in each slab, or the volume, based on a flow encoding protocol that compares a phase difference between one or more of the echoes.

10. The method of claim 1, wherein each slab of the plurality is further aligned with respect to the volume such that each slab is substantially perpendicular to a flow direction of the fluid.

11. An MRI system for phase-contrast imaging of a fluid within a volume of an imaged subject, the MRI system comprising:
   a magnet assembly configured to acquire a plurality of slabs, each slab imaging the fluid flowing within a portion of the volume;
   an MRI controller configured to volume merge the plurality of slabs to form an image of the volume; and
   wherein each slab of the plurality is aligned with respect to the volume such that each slab of the plurality is continuously supplied with a plurality of magnetically unsaturated portions of the fluid during acquisition.

12. The system of claim 11, wherein the plurality of slabs is based at least in part on a k-space acquired with:
   a Cartesian radial or a spiral view-order in ky-kz;
   a non-Cartesian trajectory; or
   a slab-interleaved acquisition.

13. The system of claim 11, wherein each slab of the plurality is separately reconstructed when the MRI controller volume merges the slabs.

14. The system of claim 11, wherein
   each slab of the plurality comprises one or more slices each having a phase modulation and an off-slab-center distance;
   one or more of the slabs share overlapping slices;
   the overlapping slices are phase aligned at a location within the overlapping slices using a phase shift common across one or more echo images of a slab of the one or more slabs sharing the overlapping slices; and the overlapping slices are averaged with a weight that is based at least in part on the off-slab-center distance of at least one of the overlapping slices when the MRI controller volume merges the slabs.

15. The system of claim 11, wherein each slab of the plurality comprises one or more slices each having a phase modulation and an off-slab-center distance;

one or more of the slabs share overlapping slices;

each slab is processed with a phase contrast to calculate a flow of the fluid; and the overlapping slices are averaged with a weight that is based at least in part on the off-slab-center distance of at least one of the overlapping slices or based at least in part on a signal in a magnitude image of at least one of the overlapping slices when the MRI controller volume merges the slabs.

16. The system of claim 15, wherein the weight is further based at least in part on a magnitude of a slab excitation profile.

17. The system of claim 11, wherein each slab of the plurality is based at least in part on a plurality of echoes; and the MRI controller is further configured to determine the flow of the fluid in each slab, or the volume, based on a flow encoding protocol that compares a phase difference between one or more of the echoes.

18. The system of claim 11, wherein each slab of the plurality is further aligned with respect to the volume such that each slab is substantially perpendicular to a flow direction of the fluid.

19. An MRI controller for an MRI imaging system that generates phase-contrast images of the flow of a fluid within a volume of an imaged subject, the MRI controller comprising a computer system and an MRI system control, the MRI controller configured to:

direct a magnet assembly to acquire a plurality of slabs, each slab imaging the fluid flowing within a portion of the volume;

volume merge the plurality of slabs to form an image of the volume; and wherein each slab of the plurality is aligned with respect to the volume such that each slab of the plurality is continuously supplied with a plurality of magnetically unsaturated portions of the fluid during acquisition.

20. The MRI controller of claim 19, wherein the plurality of slabs is based at least in part on a k-space acquired with:

a Cartesian radial or spiral view-order in ky-kz;

a non-Cartesian trajectory; or a slab-interleaved acquisition.

21. The MRI controller of claim 19, wherein each slab of the plurality is separately reconstructed when the MRI controller volume merges the plurality of slabs.

22. The MRI controller of claim 19, wherein each slab of the plurality comprises one or more slices each having a phase modulation and an off-slab-center distance;

one or more of the slabs share overlapping slices;

the overlapping slices are phase aligned at a location within the overlapping slices using a phase shift common across one or more echo images of a slab of the one or more slabs sharing the overlapping slices; and the overlapping slices are averaged with a weight that is based at least in part on the off-slab-center distance of at least one of the overlapping slices when the MRI controller volume merges the slabs.

23. The MRI controller of claim 19, wherein each slab of the plurality comprises one or more slices each having a phase modulation and an off-slab-center distance;

one or more slabs share overlapping slices;

each slab is processed with a phase contrast to calculate a flow of the fluid; and the overlapping slices are averaged with a weight that is based at least in part on the off-slab-center distance of at least one of the overlapping slices or based at least in part on a signal in a magnitude image of at least one of the overlapping slices when the MRI controller volume merges the slabs.

24. The MRI controller of claim 23, wherein the weight is further based at least in part on a magnitude of a slab excitation profile.

25. The MRI controller of claim 19, wherein each slab of the plurality is based at least in part on a plurality of echoes; and the MRI controller is further configured to determine the flow of the fluid in each slab, or the volume, based on a flow encoding protocol that compares a phase difference between one or more of the echoes.

26. The MRI controller of claim 19, wherein each slab of the plurality is further aligned with respect to the volume such that each slab is substantially perpendicular to a flow direction of the fluid.

* * * * *